(12) United States Patent
Meyers et al.

(10) Patent No.: US 6,549,050 B1
(45) Date of Patent: Apr. 15, 2003

(54) PROGRAMMABLE LATCH THAT AVOIDS A NON-DESIRED OUTPUT STATE

(75) Inventors: Steven C. Meyers, Round Rock, TX (US); Terry D. Little, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/951,369

(22) Filed: Sep. 13, 2001

(51) Int. Cl.[7] .............................................. H03K 3/037
(52) U.S. Cl. ...................................................... 327/217
(58) Field of Search ................................ 327/199, 214, 327/215, 217, 219, 223–225

(56) References Cited

U.S. PATENT DOCUMENTS

| | | | | |
|---|---|---|---|---|
| 4,540,903 A | * | 9/1985 | Cooke et al. .................. 326/16 |
| 5,208,487 A | * | 5/1993 | Matsuura et al. ............. 327/208 |
| 6,373,310 B1 | * | 4/2002 | Jacobs ........................ 327/215 |
| 6,429,712 B1 | * | 8/2002 | Gaiser et al. ................. 327/217 |

* cited by examiner

*Primary Examiner*—My-Trang Nu Ton
(74) *Attorney, Agent, or Firm*—Kevin L. Daffer; Conley, Rose P.C.

(57) ABSTRACT

A circuit and method are provided for ensuring a non-desired output state of a latch or flip-flop cannot be produced. The latch can be configured as a set dominant, reset dominant, or memory dominant circuit by simply placing programmed voltage values on select transistors of the latch. The programmed values will cause either the set input, the reset input, or both set and reset inputs to have a complimentary effect on the output signals even though the set and reset inputs are at the same logic level. The set, reset, and memory dominant circuit is identical in structure; however, the set, reset, and memory dominant features are derived solely by placing programmed values on corresponding transistors within the identical structure. A generic latch circuit can, therefore, be said to operate in one of three dominant ways depending on the programmed values chosen by a selector and fed to a prioritizer.

15 Claims, 3 Drawing Sheets

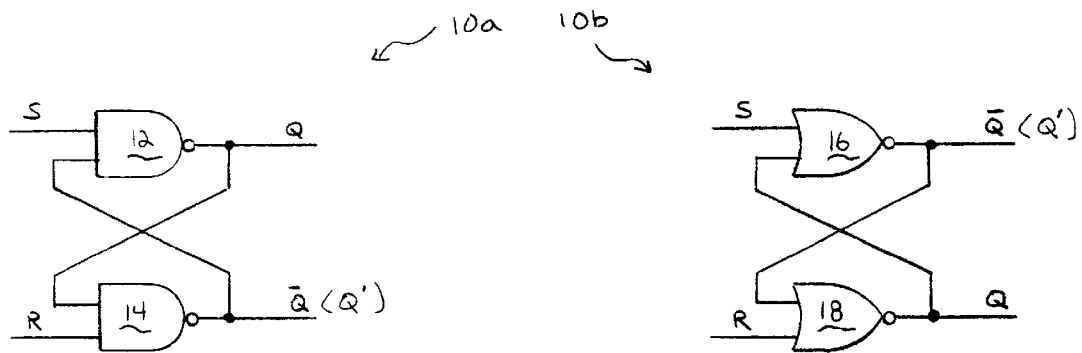
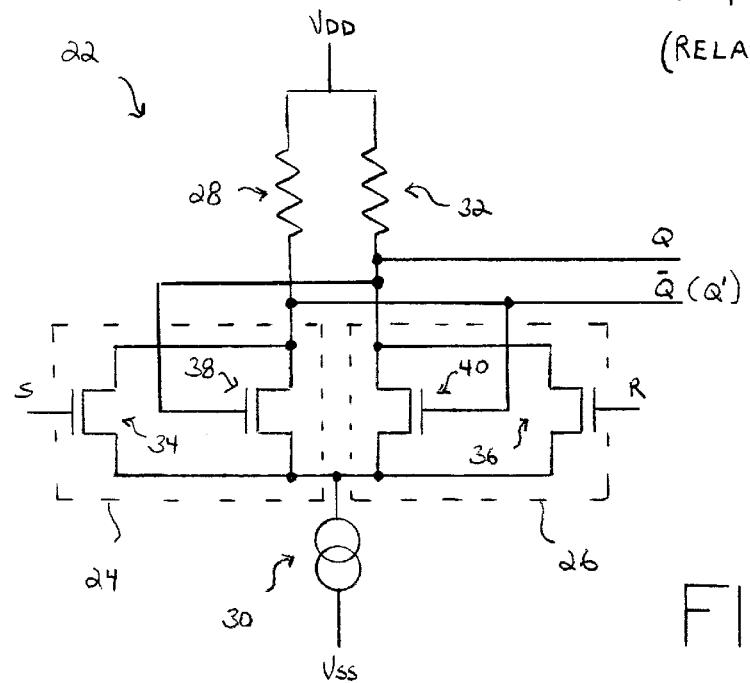
FIG. 1
(RELATED ART)
FIG. 2

PROGRAMMABLE LATCH THAT AVOIDS A NON-DESIRED OUTPUT STATE

BACKGROUND OF THE INVENTION

1. Field of the Invention

This invention relates to an architecture, circuitry and method for avoiding a non-desired output from a latch. The latch is operable from set and reset inputs, and is programmed to prohibit the latch output entering into a state or condition where complementary output signals from the latch are at the same logic level.

2. Description of the Related Art

The following descriptions and examples are not admitted to be prior art by virtue of their inclusion within this section.

A latch is typically understood to be any device which can store information. A popular form of a latch is alternatively known as a "flip-flop." A latch or flip-flop is designed to produce an output that is stable in one of two logic states. The output logic level will remain until the input to the latch undergoes a change in logic level.

Output from the latch can be at a "true," "on," "high," or "1" logic level or, alternatively, at a "false," "off," "low," or "0" logic level. For convenience in relating relativity to logic level, the former logic level, logical 1, is assumed to be the most positive voltage and the latter logic level, logical 0, represents the most negative voltage value. This relationship is known as positive logic and is used as a convention herein.

There are several types of latches used to store logical 1 or logical 0 logic levels. Latches can be classified as either clocked or non-clocked. If clocked, a clock pulse controls the times at which outputs from the latch can transition. For example, a toggle latch will impart toggling action on the output of the latch during transitions of the clock pulse whenever the toggling input is at a logical 1 logic level. Other forms of latches may not require any clock input whatsoever. For example, a set/reset (SR) latch causes an output from the latch to be set or reset dependent on the logic levels of signals placed on the set and reset inputs.

Regardless of whether a latch is clocked or not, there are generally two complimentary outputs produced from a latch. The complimentary outputs are oftentimes referred to as differential outputs, in that while one output is at a logical 1 logic level, the other output is at a logical 0 logic level (i.e., complimentary of the former logic level). The complimentary outputs are oftentimes labeled Q and Q'. When one output is at the logical 1 state, the other output is always at a logical 0 state. If the latch changes state, then both Q and Q' change. A latch is considered to be "set" when Q is in a logical 1 state and Q' is in a logical 0 state. Conversely, the latch is "reset" when Q is in a logical 0 state, and Q' is in a logical 1 state. Generally, a latch is reset in anticipation of it being subsequently set to store binary information.

A simple example of a non-clocked set/reset (SR) latch is shown in FIG. 1. In particular, FIG. 1 illustrates a NAND gate SR latch 10a and a NOR gate SR latch 10b. Latch 10a comprises a pair of cross-connected NAND gates 12 and 14, while latch 10b comprises a pair of cross-connected NOR gates 16 and 18. Latches 10 have two inputs labeled S and R (for set and reset) and, therefore, are classified as SR latches. Each latch 10 also has a pair of complimentary outputs labeled Q and "Q bar" (or Q').

Referring to the truth tables 20a and 20b, logic levels are shown for outputs Q and Q' corresponding to inputs S and R. Truth table 20a represents the operation of the NAND gate SR latch 10a, while truth table 20b represents the operation of the NOR gate SR latch 10b. Referring to truth table 20a, it can be seen that if the S input goes to a logic 0 level, then the latch will go to its set state (Q equals a logic 1 level), and will remain in that state until reset. When the R input goes to a logic 0 level, then the latch will go to its reset state and stay there until it is set again. Thus, an SR latch changes state upon sensing a change in state at the S or R inputs, and stores the results of the change until the opposite input is activated. Truth table 20b indicates that the NOR gate SR latch will go to a set state whenever the S input goes to a logic 1 level, and will go to a reset state when the R input goes to a logic 1 level.

The set and reset states are noted as "SET" and "RST" shown in FIG. 1. In addition to the set and reset states, there are two special conditions of interest for an SR latch. First, whenever the S and R inputs are at a logic 1 level (for the NAND gate embodiment 10a) or at a logic 0 level (for the NOR gate embodiment 10b) no change is made to the complimentary outputs. This state is noted as a memory ("MEM") state since the outputs retain their previous logic levels. However, if the set and reset inputs are at a logic 0 level (for the NAND gate embodiment 10a) or at a logic 1 level (for the NOR gate embodiment 10b), then the complimentary output conductors enter the same state: either logic 1 level for the NAND gate latch 10a or a logic 0 level for the NOR gate latch 10b. Having the same logic level on the complimentary output is not desired and, accordingly, this state is labeled "ND."

A non-desired output state is to be prevented for at least two reasons. First, the complimentary outputs are generally used elsewhere in the circuit subsystem. That subsystem depends on the Q output being 180° out of phase with the Q' output. Having the Q and Q' outputs at the same logic levels could be catastrophic to the operation of any load coupled to receive complimentary inputs. Second, the non-desired state can produce non-deterministic logic levels. For example, if a transistor within logic gate 14 is made having stronger drive outputs than a transistor within NAND gate 12, then even through the set and reset inputs are at a logic 0 level, the Q output may skew to a differential logic level from that of the Q' output. This may indicate a set state when, in fact, the set and reset inputs are not in a set condition (e.g., the set input being at a logic 0 level and the reset input being at a logic 1 level for the exemplary NAND gate example).

Most designers attempt to avoid placing a latch in a non-desired state. However, there may be times when the non-desired state is difficult to avoid and is uncontrollably dependent on the set and reset input conditions. It would therefore be desirable to introduce an improved SR latch that, regardless of the SR input values, the latch can never enter a non-desired state. The improved latch would represent a considerable advance over conventional SR latches since a designer can use such a latch with impunity, and with little regard to controlling the set and reset inputs for the purpose of avoiding the non-desired state.

SUMMARY OF THE INVENTION

The problems outlined above are in large part solved by an improved latch. Preferably, the latch is an SR latch that need not be clocked, and can avoid non-desired states. The latch can be implemented as a quasi-NAND gate or quasi-NOR gate configuration. In addition to the set and reset inputs, the latch also receives programmable inputs. Depending on the logic value of the programmable inputs, the latch can be programmed to give priority to the set input, the reset input, or both.

The programmed inputs are fed onto gate conductors or base conductors of respective transistors coupled in series with the transistors, which receive the set and reset inputs. The series-connected resistors are cross-coupled with and parallel to corresponding transistors within a memory or latch cell. The pairs of series-connected transistors can, therefore, form a prioritizer or priority encoder according to one embodiment. The memory element simply stores complimentary outputs produced from the prioritizer and retains those outputs onto the output conductors. A selector can be used to select either "set bar" (set'), "reset bar" (reset'), or both set' and reset' to be placed on the programmable inputs of the prioritizer.

The latch can be implemented using solely n-type (NMOS) transistors or bipolar (NPN) transistors. Alternatively, the latch can use p-type (PMOS) transistors or PNP transistors. If implemented with the latter form of transistors, then the set and reset inputs can receive complimentary set and reset values, while the programmable inputs can receive set, reset, or set and reset values. Use of, for example, PMOS transistors rather than NMOS transistors merely indicate that the values on the set, reset, and programmable inputs are switched to the corresponding complimentary values. This also applies to switching between either a sourcing power supply or ground. If NMOS transistors are used, then a sourcing power supply ($V_{DD}$) is used on one programmable input and if PMOS transistors are used, then a ground ($V_{SS}$) is used in lieu of $V_{DD}$.

According to one embodiment, a latch includes a pair of output conductors, a set conductor, and a reset conductor. The latch further includes a circuit coupled to retain dissimilar logic values upon the pair of output conductors whenever the same logic value is placed on the set and reset conductors. In other words, the latch will avoid the non-desired state.

According to another embodiment, a circuit such as a latch can include a selector and a prioritizer. The selector chooses among a set of voltage values, and the prioritizer receives set and reset input signals of the same logic value and will match dissimilar logic values upon output signals depending on which voltage value is selected by the selector. The prioritizer can, therefore, establish the set input value priority over the reset input value priority, or vice-versa, depending on which voltage value is chosen by the selector.

According to yet another embodiment, a method is provided for preventing a non-desired output from a latch. The method includes receiving a similar logic value upon set and reset conductors of the latch, while preventing the latch from producing a similar logic value on differential output conductors of the latch.

BRIEF DESCRIPTION OF THE DRAWINGS

Other objects and advantages of the invention will become apparent upon reading the following detailed description and upon reference to the accompanying drawings in which:

FIG. 1 is a circuit schematic of NAND gate and NOR gate latches, with corresponding truth tables noting a non-desired output condition of the respective latches;

FIG. 2 is a circuit schematic example of a NOR gate latch configured using MOS or Bipolar transistors that can operate in a current mode and prevent a non-desired output condition if the set and reset conductors receive logic one voltage values;

Figure 3:
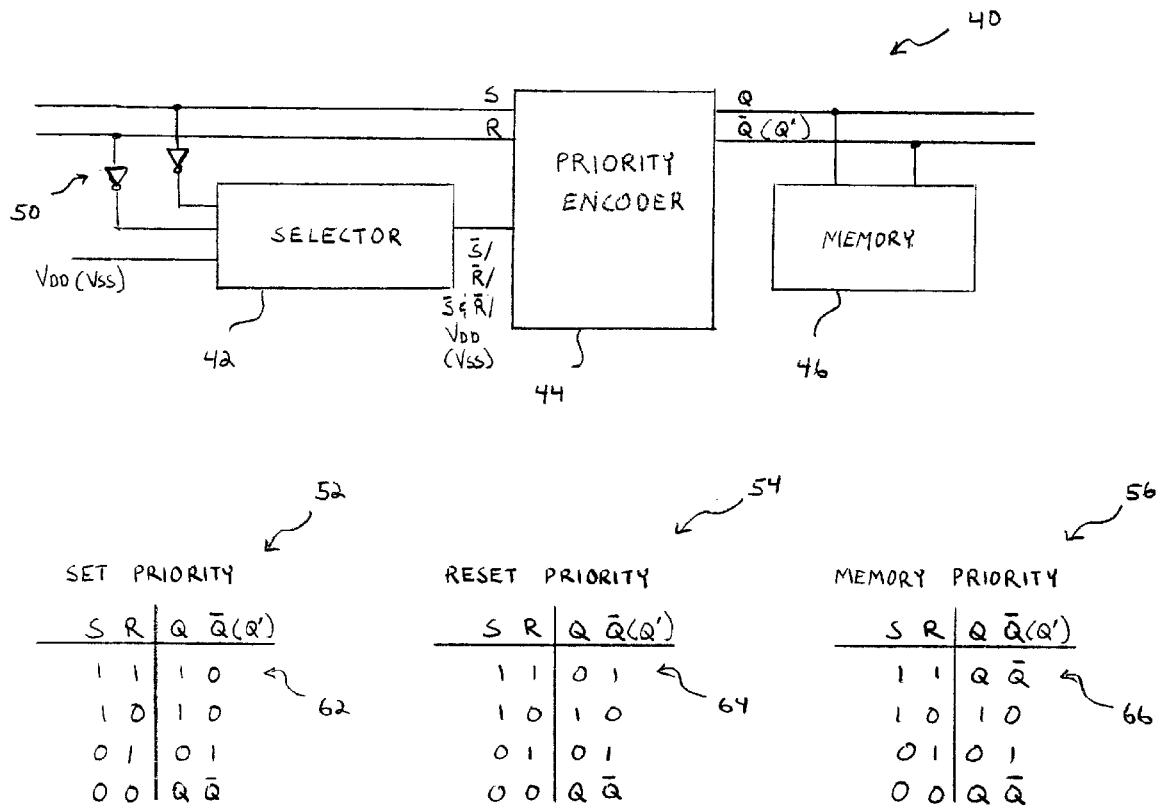
FIG. 3 is a block diagram of a SR latch that selects whether the set input, the reset input, or both the set and reset inputs will prioritize how the output conductors will respond to both the set and reset conductors having the same logic voltage value, according to one example.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 2 illustrates the various circuit components which make up a NOR gate SR latch 22. Latch 22 includes a pair of cross-coupled NOR gates 24 and 26, shown in dashed line. NOR gate 24 can include two transistors connected in parallel between a resistor 28 and a current source 30. Similarly, NOR gate 26 includes a pair of transistors coupled between resistor 32 and current source 30. Resistors 28 and 32 serve mostly as pull-up resistors if current does not flow through them or as pull-down resistor if current does flow.

Current source 30 can be envisioned in numerous ways. For example, current source can simply be a resistor or a transistor with the emitter/source connected to ground $V_{SS}$, with the gate/base connected so that the source/drain or collector/emitter produces current sunk into $V_{SS}$. Alternatively, the current source can be two transistors connected in series, a transistor and a resistor connected in series, etc., the function of which is merely to provide a current path sourced to $V_{SS}$. If, for example, the set and reset inputs receive a logic 1 level and the transistors 34 and 36 are NMOS or NPN transistors, then a current path will be established through transistors 34 and 36 to cause the Q and Q' outputs to be at a logic 0 level. Having the complimentary outputs at the same logic level would be a non-desired output state that is to be avoided. The latch 22 of FIG. 2 is, therefore, shown to provide an example of one way in which to form a latch. In the example provided, a NOR gate SR latch is shown.

The transistors can be MOSFETs or bipolar transistors. The current source may or may not be needed. However, if used, the current source provides Current Mode Logic (CML). By providing a relatively constant current at the source or emitter of corresponding transistors within NOR gates 24 and 26, the transistors within such NOR gates can be prevented from fully conducting and going into a saturation mode. Thus, there may be some resistance involved with current source 30 which will place the source/emitter voltage near the gate voltages of the transistors. Hence, the CML mode of operation allows very fast switching time by eliminating the saturation-mode of operation. In some circles of nomenclature, the current source 30 can be considered within a bipolar arrangement as coupled to emitters of the corresponding transistors. The common emitter resistor associated with current source 30, and applied to the differential amplifier of transistors 38 and 40, causes the overall configuration to be referred to as emitter-coupled logic (ECL).

Regardless of whether CML, ECL, or whether MOSFETs or bipolar transistors are used, the intent is to prevent a non-desired state. This applies equally to whether or not the SR latch is configured using quasi-NOR gates or quasi-NAND gates with the cross-coupled outputs. FIG. 3 illustrates an improved circuit that can be employed as a latch and, preferably, an SR latch 40. Latch 40 includes a selector 42, a prioritizer 44, and memory 46. The selector is coupled to receive complimentary logic levels from the inputs sent to prioritizer 44. For example, priority encoder 44 may receive set and reset signals, therefore, selector 42 receives set' anti reset' voltage values. Whatever logic level is sent to the input of prioritizer 44 is inverted by inverters 50 and placed into the input of selector 42. Additionally, the positive and negative power supply rails ($V_{DD}$ or $V_{SS}$) voltages are input to selector 42.

Selector 42 thereby selects at least one, and preferably two, of the signals sent to selector 42 depending on how the prioritizer 44 is to operate. Prioritizer 44 thereby chooses which input signal, set, reset, or both, should be given priority in determining how to set the differential output voltages Q and Q'. For example, selector 42 can select S' as an input to prioritizer 44. Upon receiving the set' input, prioritizer 44 will operate as a set dominant circuit. If R' is selected, then prioritizer 44 will operate as a reset dominant circuit. Alternatively, if both S' and R' are selected, then prioritizer 44 will operate as a memory dominant circuit. Depending on whether prioritizer 44 uses PMOS or NMOS transistors, either $V_{DD}$ or $V_{SS}$ will be placed into prioritizer 44.

If prioritizer 44 operates as a set dominant circuit, then the set input will take priority, and a truth table will result from prioritizer 44, as shown by reference numeral 52. Truth table 52 indicates that if both set and reset inputs have a logic 1 level, then the Q output will take the same value as the set input, with the Q' output being forced to an opposite logic level to that of Q. Thus, the set input will dominate and cause the Q value of the normally non-desired output state to be forced to the set input value (i.e., the set dominant circuit forces the non-desired output state to be "set").

A reset dominant circuit causes priority to be given to the reset input, as shown by truth table 54. Thus, whenever both the set and reset inputs are at a logic 1 level, then the reset input will cause the Q' output to be at a logic 1 level and the Q output to be at an opposite logic level thereby denoting a "reset" condition. Truth table 56 indicates the operation of a memory dominant circuit operation. When both S' and R' are selected by selector 42, prioritizer 44 will cause the non-desired state of both S and R inputs at logic 1 value to be forced into the same condition as if the latch 40 were in a memory state (i.e., the output values Q and Q' maintain the same logic state as the state they were in prior to entering the non-desired state where set and reset are at a logic 1 value).

The non-desired states 62, 64, and 66 of the set dominant, reset dominant, and memory dominant circuits are, therefore, shown in FIG. 3 to take on the set state, the reset state, and the memory state of an SR latch. These states are forced upon the latch outputs instead of the normal output conditions where both complimentary outputs are at the same logic level of conventional designs.

Figure 4:
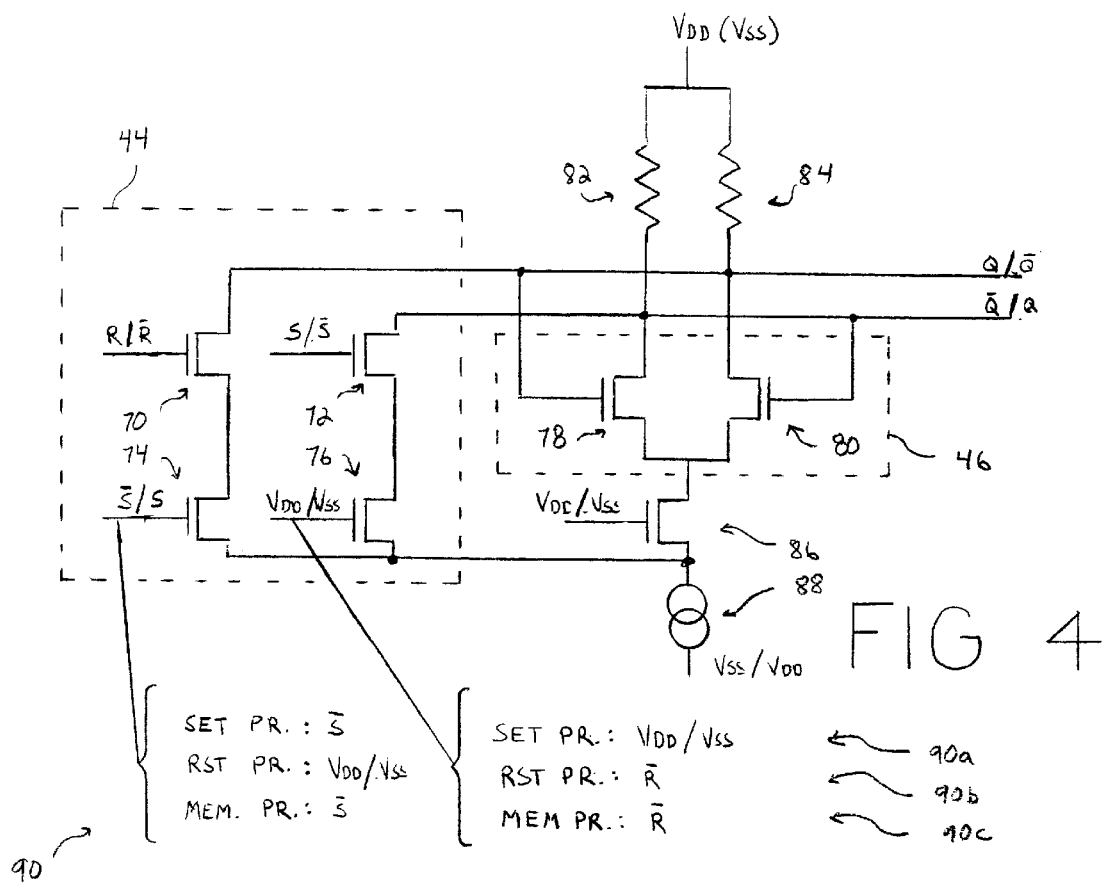
FIG. 4 is a circuit schematic of the various blocks of FIG. 3, according to one embodiment, depictive of numerous corresponding transistors being either NMOS, PMOS, NPN or PNP transistors coupled to form either a set-dominant, a reset-dominant or memory-dominant SR latch.

FIG. 4 illustrates an example by which prioritizer 44 and memory 46 can be implemented. If the transistors are of the same type, either NMOS or PMOS (or either NPN or PNP), then prioritizer 44 includes two pairs of series-connected transistors. The upper transistors 70 and 72 receive the set and reset inputs into the latch, while the lower transistors 74 and 76 receive programmed input voltages. The series-connected pairs of transistors produce the output voltages upon Q and Q', and those voltages are latched in their present state by memory 46. Memory 46 can include a pair of cross-coupled transistors 78 and 80. Pull-up transistors 82 and 84 in combination with transistors 78 and 80 serve as a differential amplifier, where current will flow through one resistor but not the other resistor will cause the outputs to be complimentary to one another. The differential amplifier function can further be carried out by, for example, a transistor 86 and a current source 88. Current source 88 can be configured similar to current source 30 in FIG. 2, where transistor 86 forwards current to the current source during operation of the differential amplifier.

FIG. 4 is illustrative of a set dominant circuit. If both the set and reset inputs are at a logic 1 level, instead of Q and Q' being both at a logic 1 level, current will flow only through transistor pairs 72 and 76, but since S' is at a logic 0 level, no current will flow through transistor pairs 70 and 74. This results in current forwarded through resistor 82, but no current through resistor 84, causing Q' being pulled down to a logic 0 level by virtue of current through transistor 78 and 86, but Q remaining at a logic 1 level by virtue of no current through resistor 84 and transistor 80. By adding transistor 74 and the complimentary logic level to the set input, transistor 74 will essentially gate off the reset transistor 70 making it have no effect on the SR latch output. Transistor 76 and 86 are shown with their gates tied to $V_{DD}$ so that these transistors are always on. These transistors are included to match the structure and biasing of transistor 74.

A reset dominant circuit is constructed similar to the set dominant circuit. However, instead of a S' and $V_{DD}$ placed on the inputs of transistors 74 and 76, a reset dominant circuit places $V_{DD}$ and R' at those inputs. A memory dominant circuit also has the same circuit structure as the set and reset dominant circuits. However, a memory dominant circuit places S' at the input of transistor 74 and R' at the input of transistor 76. In a memory dominant circuit, when the set and reset signals are at the same logic level (either a logic 0 or logic 1 value), the set and reset functions are disabled and the SR latch stays in the same state as it was before receiving set and reset signals of the same logic value. Item 90 indicates the signals selectably placed on the gate/base of transistor 74 and 76 during a set dominant configuration 90a, a reset dominant configuration 90b, and a memory dominant configuration 90c.

FIG. 4 illustrates in the right hand side of the backslash ("/"), alternative configurations. For example, instead of using NMOS and NPN transistors, PMOS and PNP transistors can be used. If, for example, PMOS or PNP transistors are used, then wherever $V_{DD}$ is used, $V_{SS}$ can be substituted therefor. Moreover, wherever reset, set, reset', or set' signals are used, the complimentary signal is substituted. In this fashion, a set dominant, reset dominant, or memory dominant circuit can be formed either using exclusively NMOS or NPN transistors, or using exclusively PMOS or PNP transistors. In addition, FIG. 4 illustrates a NOR gate SR latch. It is recognized, however, that a NAND gate SR latch can also be used by simply rearranging the transistors from a parallel/serial configuration to a serial/parallel configuration with various other modifications which would be known to those skilled in the art having the benefit of this disclosure. Accordingly, the present circuit can be employed either as a NAND gate configuration, a NOR gate configuration, with NMOS, PMOS, NPN, PNP transistors, all of which would be readily known after having read this disclosure.

Figure 5:
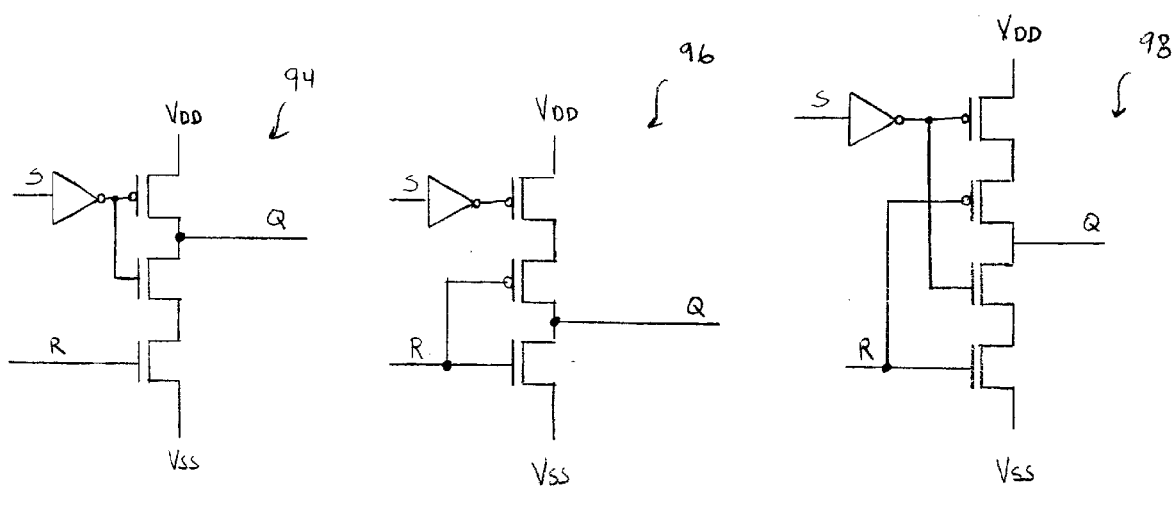
FIG. 5 is a circuit schematic of the prioritizer block of FIG. 3, according to another embodiment, depictive of both NMOS and PMOS transistors coupled to form either a set-dominant, a reset-dominant, or memory-dominant SR latch.

In addition to the aforementioned arrangements, prioritizer 44 can also be configured using both PMOS transistors and NMOS transistors (i.e., in a CMOS arrangement). FIG. 5 illustrates three examples of a CMOS set dominant circuit 94, a CMOS reset dominant circuit 96 and a CMOS memory dominant circuit 98. If both S and R are at a logic 1 value, then Q output from circuit 94 will be pulled to a logic 1 value. If both S and R are at a logic 1 value, then Q output from circuit 96 will be pulled to a logic 0 value. If both S and R are at a logic 1 value, then Q output from circuit 98 will not be pulled to either a logic 1 value or a logic 0 value, but would remain in its previous value.

It is recognized that a latching circuit (or memory circuit 46) can be coupled to retain the set, reset arid memory dominant outcomes of circuits 94, 96 and 98. Moreover, the Q' output, complementary to Q output, can be readily derived by an inverter coupled to the output conductor. An inverter may also be needed to form the complementary S' input from the S input of set dominant circuit 94. Adding an inverter to the set input path of circuit 94 will cause a delay from that of the rest input signal. Likewise, adding an inverter to the set input path of circuit 96 will cause a delay from that of the reset input signal. This delay can be avoided by making certain transistors of circuits 94 and 96 by changing the "flavor" of the transistors. For example, the PMOS upper transistor can be changed to an NMOS transistor in circuit 94. However, this would cause the latch (memory circuit) connected to the output Q to not drive to the Vdd rail, which will require compensation of the threshold of the main latch inverter to be lowered to a threshold voltage divided by two. The same applies to circuit 96. Thus, whenever it is desired to minimize the gate delay through circuits 94 and 96 by avoiding an extra inverter at an input, the transistors can be changed from NMOS to PMOS (and vice versa); however, the threshold of the latching transistor coupled to the output conductor must be modified in that its threshold is either increased or lowered by a half threshold voltage. Eliminating the inverter on the set input path of the memory dominant circuit 98 can be accomplished by making the upper transistor an NMOS transistor instead of a PMOS transistor, and the second from the bottom transistor a PMOS transistor instead of an NMOS transistor. Changing the flavor of the transistors in circuit 98 avoids the added gate delay of the input inverter; however, reduces the noise margin of the overall circuit by using PMOS transistors in the ground path and an NMOS transistor in the Vdd path. The signal driving the latching circuit coupled to the output conductor will not drive rail to rail.

It will be appreciated to those skilled in the art having the benefit of this disclosure that the embodiments described herein are believed useful in forming a latch that need not be clocked, and that employs set and reset inputs. The embodiments prove useful in preventing a non-desired state where outputs that are designed to be complimentary nonetheless have the same logic level. The present latch is envisioned having either MOSFETs or bipolar transistors, and can be employed either having only NMOS transistors, only PMOS transistors, or both. Likewise, the latch can use only NPN transistors, PNP transistors, or both. The gate inputs of certain transistors can be programmed by a selector to place the latch in either a set dominant, reset dominant, or memory dominant configuration based solely on the voltage values fed to the latch by the selector. Moreover, the gate delay through the various set, reset and memory dominant circuits have minimum gate delay (i.e., propagation delay). It is intended that the following claims be interpreted to embrace all such modifications and changes envisioned by such claims. Accordingly, the specification and drawings are to be regarded in an illustrative rather than restrictive sense.

What is claimed is:

1. A latch, comprising:
   a pair of output conductors;
   a set conductor and a reset conductor; and
   a circuit coupled to retain dissimilar logic values upon the pair of output conductors whenever the same logic value is placed on the set and reset conductors, wherein the circuit comprises a selector adapted to selectively place either a power supply voltage, a complementary set voltage, or a complementary reset voltage upon a gate or base conductor of first and second transistors within the circuit.

2. The latch as recited in claim 1, wherein the logic value placed on the set conductor is also placed on a first conductor but not a second conductor of the pair of output conductors if the selector places the complementary set voltage upon the first transistor gate or base.

3. The latch as recited in claim 1, wherein the logic value placed on the reset conductor is also placed on a second conductor but not a first conductor of the pair of output conductors if the selector places the complementary reset voltage upon the second transistor gate or base.

4. The latch as recited in claim 1, wherein the logic value placed on the set conductor and the reset conductor causes no change in logic value on both a first conductor and a second conductor of the pair of output conductors if the selector places the complementary set voltage upon the first transistor gate or base and the complementary reset voltage upon the second transistor gate or base.

5. The latch as recited in claim 1, wherein the power supply voltage is either a sourcing power supply or ground.

6. A latch, comprising:
   a pair of output conductors;
   a set conductor and a reset conductor; and
   a circuit coupled to retain dissimilar logic values upon the pair of output conductors whenever the same logic value is placed on the set and reset conductors, wherein the circuit comprises a selector adapted to selectively place either a power supply voltage, a set voltage, or a reset voltage upon a gate or base conductor of first and second transistors within the circuit.

7. The latch as recited in claim 6, wherein the logic value placed on the set conductor is also placed on a first conductor but not a second conductor of the pair of output conductors if the selector places the set voltage upon the first transistor gate or base.

8. The latch as recited in claim 6, wherein the logic value placed on the reset conductor is also placed on a second conductor but not a first conductor of the pair of output conductors if the selector places the reset voltage upon the second transistor gate or base.

9. The latch as recited in claim 6, wherein the logic value placed on the set conductor and the reset conductor causes no change in logic value on both a first conductor and a second conductor of the pair of output conductors if the selector places the set voltage upon the first transistor gate or base and the reset voltage upon the second transistor gate or base.

10. The latch as recited in claim 6, wherein the power supply voltage is either a sourcing power supply or ground.

11. A circuit, comprising:
a selector adapted to select at least one voltage value from among a set of voltage values forwarded to the selector; and
a prioritizer adapted to receive set and reset input signals of the same logic value and latch dissimilar logic values upon output signals depending on which of the at least one voltage value is selected.

12. The circuit as recited in claim 11, wherein the selector comprises:
selector input conductors coupled to receive the set and reset input signals, or complementary signals thereof; and
a selector output conductor coupled to receive either the set input signal, the reset input signal, or both the set and reset input signals, or a signal of opposite logic value to the set input signal, the reset input signal or both the set and reset input signals.

13. The circuit as recited in claim 12, wherein the prioritizer comprises:
a pair of output conductors;
a first transistors and a second transistor, each of which have a gate or base conductor; and
wherein one of the pair of output conductors receives the same logic value as the set input signal and the other one of the pair of output conductors receives an opposite logic value as the set input signal whenever the selector output conductor receives the set input signal, or the signal of opposite logic value to the set input signal.

14. The circuit as recited in claim 12, wherein the prioritizer comprises:
a pair of output conductors;
a first transistors and a second transistor, each of which have a gate or base conductor; and
wherein one of the pair of output conductors receives the same logic value as the reset input signal and the other one of the pair of output conductors receives an opposite logic value as the reset input signal whenever the selector output conductor receives the reset input signal, or the signal of opposite logic value to the reset input signal.

15. The circuit as recited in claim 12, wherein the prioritizer comprises:
a pair of output conductors;
a first transistors and a second transistor, each of which have a gate or base conductor; and
wherein each of the pair of output conductors retains a logic value identical to a logic value previous to when the set and reset input signals are of the same logic value whenever the selector output conductor receives the set input signal and the reset input signal, or the signals of opposite logic value to the set and reset input signals.

* * * * *